United States Patent
Liu (10) Patent No.: US 9,165,903 B2
(45) Date of Patent: Oct. 20, 2015

(54) MULTI-FUNCTIONAL DETACHABLE AND REPLACEABLE WIRE BONDING HEATING PLATE

(71) Applicant: Pram Technology Inc., Kaohsiung (TW)

(72) Inventor: Wen-Long Liu, Kaohsiung (TW)

(73) Assignee: PRAM TECHNOLOGY INC., Kaohsiung (TW)

( * ) Notice: Subject to any disclaimer, the term of this patent is extended or adjusted under 35 U.S.C. 154(b) by 0 days.

(21) Appl. No.: 14/265,382

(22) Filed: Apr. 30, 2014

(65) Prior Publication Data

US 2014/0319199 A1 Oct. 30, 2014

(30) Foreign Application Priority Data

Jul. 18, 2013 (TW) .............................. 102213564 U (51) Int. Cl.
*B23K 37/00* (2006.01)
*H01L 23/00* (2006.01)
*B23K 20/00* (2006.01)

(52) U.S. Cl.
CPC .............. *H01L 24/85* (2013.01); *B23K 20/004* (2013.01); *H01L 24/78* (2013.01); *H01L 24/48* (2013.01); *H01L 2224/48227* (2013.01); *H01L 2224/48247* (2013.01); *H01L 2224/78251* (2013.01); *H01L 2924/01322* (2013.01)

(58) Field of Classification Search
None
See application file for complete search history.

(56) References Cited

U.S. PATENT DOCUMENTS

| | | | | |
|---|---|---|---|---|
| 4,765,531 A | * | 8/1988 | Ricketson et al. | 228/180.5 |
| 4,975,050 A | * | 12/1990 | Yamazaki et al. | 432/250 |
| 5,348,316 A | * | 9/1994 | Lin | 279/3 |
| 5,624,499 A | * | 4/1997 | Mizuno et al. | 118/725 |
| 5,632,434 A | * | 5/1997 | Evans et al. | 228/44.7 |
| 5,641,114 A | * | 6/1997 | Horton et al. | 228/222 |
| 5,667,128 A | * | 9/1997 | Rohde et al. | 228/49.5 |
| 6,031,216 A | * | 2/2000 | Singh et al. | 219/633 |
| 6,390,350 B2 | * | 5/2002 | Fogal et al. | 228/4.5 |
| 7,336,487 B1 | * | 2/2008 | Chrysler et al. | 361/699 |
| 7,357,288 B2 | * | 4/2008 | Hosotani et al. | 228/6.2 |
| 7,578,423 B1 | * | 8/2009 | Duan et al. | 228/44.7 |
| 7,629,231 B2 | * | 12/2009 | Maki et al. | 438/464 |
| 7,766,211 B2 | * | 8/2010 | Kwan et al. | 228/4.5 |
| 7,854,365 B2 | * | 12/2010 | Li et al. | 228/180.21 |

(Continued)

FOREIGN PATENT DOCUMENTS

| | | | | | |
|---|---|---|---|---|---|
| JP | 61101041 A | * | 5/1986 | | H01L 21/60 |
| JP | 62154745 A | * | 7/1987 | | H01L 21/60 |

(Continued)

*Primary Examiner* — Kiley Stoner
(74) *Attorney, Agent, or Firm* — Chun-Ming Shih (57) ABSTRACT

A multi-functional detachable and replaceable wire bonding heating plate is provided with a heat blocking layer, a heating layer, a heat equalization layer, and a top layer. The bottom of the heat blocking layer has a recessed portion and the heating layer is disposed on top of the heat blocking layer. The heat equalization layer is disposed on top of the heating layer. A detachable and replaceable top layer is disposed on top of the heat equalization layer wherein a protruding support block is disposed on top of the top layer. The heat equalization layer and the top layer can be securely bonded to each other by the attraction force method, the engaging method, and the vacuum method. The invention allows the top layer to be timely detached and properly replaced to meet the specifications of different lead frames or PCB substrates and can reduce the production cost.

10 Claims, 9 Drawing Sheets

(56) References Cited

U.S. PATENT DOCUMENTS

| | | | |
|---|---|---|---|
| 8,025,205 B2* | 9/2011 | Sakai et al. | 228/180.22 |
| 8,074,868 B2* | 12/2011 | Maki et al. | 228/180.21 |
| 8,129,220 B2* | 3/2012 | Or | 438/107 |
| 8,735,764 B2* | 5/2014 | Weckerle et al. | 219/85.1 |
| 8,899,289 B2* | 12/2014 | Deguchi et al. | 156/349 |
| 2001/0007084 A1* | 7/2001 | Koo et al. | 700/117 |
| 2002/0066775 A1* | 6/2002 | Evers et al. | 228/212 |
| 2002/0185648 A1* | 12/2002 | Furukawa et al. | 257/79 |
| 2003/0014980 A1* | 1/2003 | Ono | 62/3.2 |
| 2003/0019906 A1* | 1/2003 | Sakai et al. | 228/1.1 |
| 2005/0061856 A1* | 3/2005 | Maki et al. | 228/234.1 |
| 2005/0161488 A1* | 7/2005 | Duan et al. | 228/42 |
| 2005/0274708 A1* | 12/2005 | Chan et al. | 219/392 |
| 2006/0163325 A1* | 7/2006 | Sadler | 228/101 |
| 2011/0073294 A1* | 3/2011 | MacDonald et al. | 165/185 |
| 2015/0173209 A1* | 6/2015 | Dhavaleswarapu et al. | |

FOREIGN PATENT DOCUMENTS

| | | | | |
|---|---|---|---|---|
| JP | 01081235 A | * | 3/1989 | H01L 21/60 |
| JP | 01187936 A | * | 7/1989 | H01L 21/52 |
| JP | 02050447 A | * | 2/1990 | H01L 21/60 |
| JP | 03225931 A | * | 10/1991 | H01L 21/60 |
| JP | 04093041 A | * | 3/1992 | H01L 21/603 |
| JP | 04094550 A | * | 3/1992 | H01L 21/60 |
| JP | 07302806 A | * | 11/1995 | H01L 21/50 |

* cited by examiner

MULTI-FUNCTIONAL DETACHABLE AND REPLACEABLE WIRE BONDING HEATING PLATE

BACKGROUND OF THE INVENTION

1. Field of the Invention

The invention relates to wire bonding heating plates, and more particularly relates to a wire bonding heating plate having a top layer that can be timely detached and properly replaced to meet the specifications of different lead frames or PCB substrates, thus to reduce the process time and production cost. The heat blocking layer can completely preserve thermal energy, produced by the heating layer, for the heat equalization layer and increase the thermal conductivity efficiency.

2. Description of Related Art

The wire bonding heating plate plays an important role in the chip wire bonding process. The main reason is that the heating plate can increase the temperature of the finger region of the wire bonding lead frame. During the wire bonding process, the eutectic bonding between the wire and the lead frame bond finger has a better effect. However, since the wire bonding lead frames are mostly frames made of the copper material and easily become oxidized in high temperatures, causing the chip and the lead frame to separate. Furthermore, if the temperature of the finger region is not high enough, the wire bonding will fail thus to seriously affect the product yield.

The wire bonding heating plates previously known have too many difficulties to cope with. When the temperature of the whole heating plate is not uniform, the wire bonding yield decreases. In order to avoid heat loss, the heating plate is kept at a specific temperature and yet unable to increase the thermal conductivity efficiency. Besides, in order to meet the specifications of different lead frames or PCB substrates, the process of changing the heating plate consumes a significant amount of time and increases the production cost.

Currently, technical individuals in this field have conducted research and developments on the temperature control of the heating plate, reduction of the heat loss and high production costs resulting from the process of changing the heating plate. However, these research and developments generally are conducted on these issues separately without integrating the solutions together effectively. As a result, wire bonding heating plates do not have the complete functionality and effectiveness in use.

Thus, the need for improvement still exists.

SUMMARY OF THE INVENTION

The objective of the invention is to provide a multi-functional detachable and replaceable wire bonding heating plate. The heating plate is equipped with heating, heat blocking, heat equalizing, detachable and replaceable functions integrated together in one plate. The invention only needs to replace the top layer to meet the specifications of different lead frames or PCB substrates, thus to reduce the production cost and to increase the wire bonding efficiency. The heat blocking layer transfers thermal energy from the heating layer to the heat equalization layer to block further heat loss and to increase the thermal conductivity efficiency. As a result, the heating layer can avoid the continuous heating process and achieve the efficiency of energy saving. The temperature sensor of the heat equalization layer can monitor the temperature change and determine the right timing of heating again.

To achieve the aforementioned goals, the multi-functional detachable and replaceable wire bonding heating plate of the invention is composed of a heat blocking layer, a heating layer, a heat equalization layer, and a top layer. The bottom of the heat blocking layer has a recessed portion and the heating layer is installed on top of the heat blocking layer. The heat equalization layer is installed on top of the heating layer. A detachable and replaceable top layer is installed on top of the heat equalization layer wherein a protruding support block is installed on top of the top layer. A first through hole interconnected within the heat blocking layer, the heating layer and the heat equalization layer is used for attraction by applying the vacuum method. The top layer has a second through hole and a groove, which is disposed in the bottom of the top layer and connects the first through hole and the second through hole.

The top of the aforementioned heat equalization layer comprises a slot and the bottom of the top layer comprises an engaging portion that is embedded in the slot.

The top of the aforementioned heat equalization layer and the bottom of the top layer are attracted to each other by magnetic force.

The aforementioned heat blocking layer can block the heat loss of the heating layer. After the heating layer is heated, the heating layer will only heat the heat equalization layer directly and the thermal conductivity efficiency will increase. After the heat transferred to the top layer brings the top layer to the required thermal level, the heat equalization layer does not need to be heated constantly, resulting in the effectiveness of energy saving.

The aforementioned heat equalization layer is equipped with a temperature sensor to monitor the temperature change of the heat equalization layer and to control the heating timing of the heating layer. Therefore, temperatures of the heat equalization layer do not appear to have significant temperature differences.

The aforementioned heating layer, the heat blocking layer and the heat equalization layer are equipped with locking elements. The heating layer and the heat blocking layer are also equipped with adjusting elements.

The middle portion of the aforementioned heat equalization layer can be porous materials.

The above and other objects, features and advantages of the invention will become apparent from the following detailed description taken with the accompanying drawings.

DETAILED DESCRIPTION OF THE INVENTION

Figure 1:
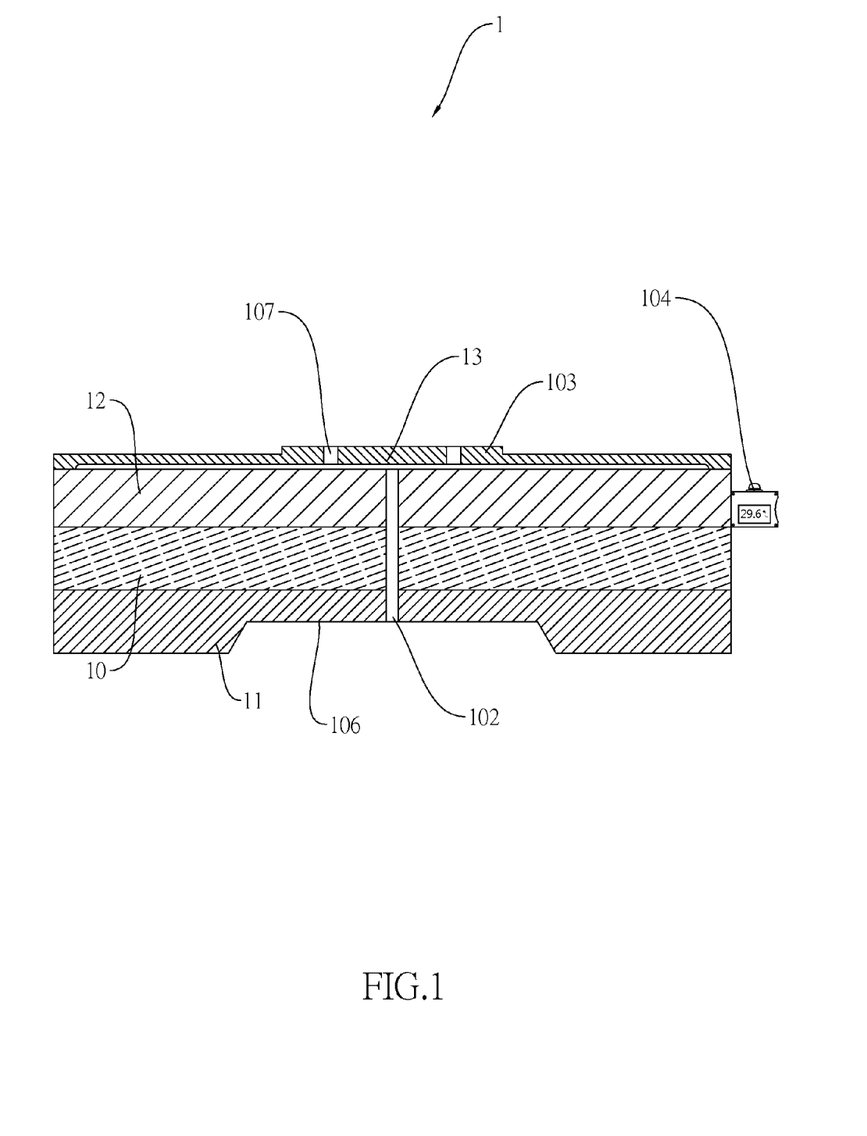
FIG. 1 is a schematic diagram of the wire bonding heating plate of the vacuum magnetic bonding mode of the invention.
Figure 2:
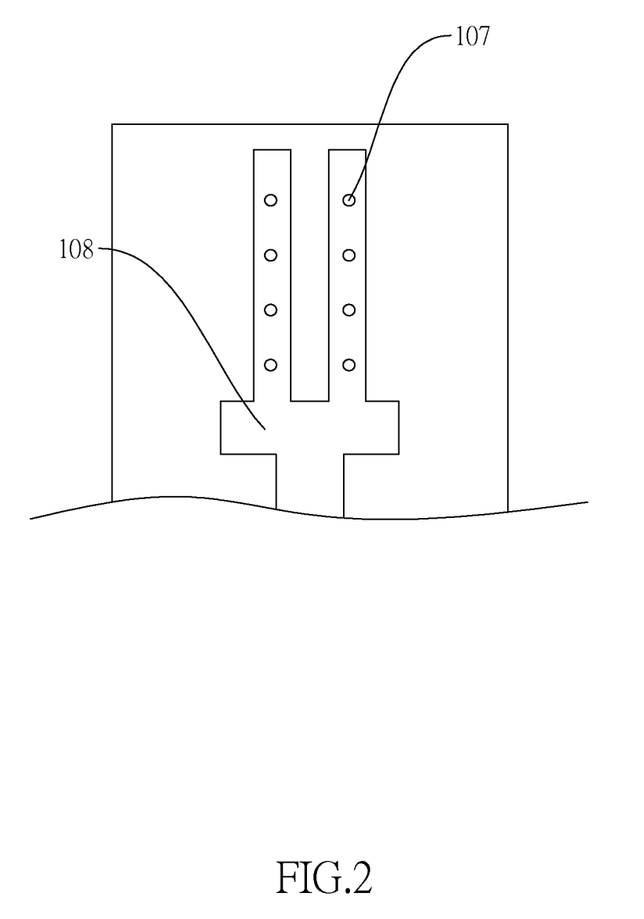
FIG. 2 is a schematic bottom view of the top layer of the wire bonding heating plate of the invention.

Referring to FIGS. 1 and 2, a multi-functional detachable and replaceable wire bonding heating plate 1 in accordance with the invention comprises a heat blocking layer 11, a heating layer 10, a heat equalization layer 12, and a top layer 13 as discussed in detail below.

Bottom of the heat blocking layer 11 has a recessed portion 106 and the heating layer 10 is installed on top of the heat blocking layer 11. The heat equalization layer 12 is installed on top of the heating layer 10. A detachable and replaceable top layer 13 is installed on top of the heat equalization layer 12 wherein a protruding support block 103 is installed on top of the top layer 13. The heat blocking layer 11, the heating layer 10 and the heat equalization layer 12 have a first through hole 102 interconnected therein. The top layer 13 has a second through hole 107 and a groove 108, which connects the first through hole 102 and the second through hole 107, is disposed in the bottom of the top layer 13.

Users can use a vacuum equipment to evacuate the first through hole 102, causing the heat equalization layer 12 and the top layer 13 securely bonded to each other. When the replacement takes place, use the vacuum equipment to cease the vacuum and the heat equalization layer 12 and the top layer 13 will separate. At the same time, the top of the heat equalization layer 12 and the bottom of the top layer 13 can be made with magnetic force separately. When the heat equalization layer 12 and the top layer 13 are in contact, both will be attracted to each other, resulting in the heat equalization layer 12 and the top layer 13 securely bonded to each other. The heat equalization layer 12 is equipped with a temperature sensor 104.

Figure 3:
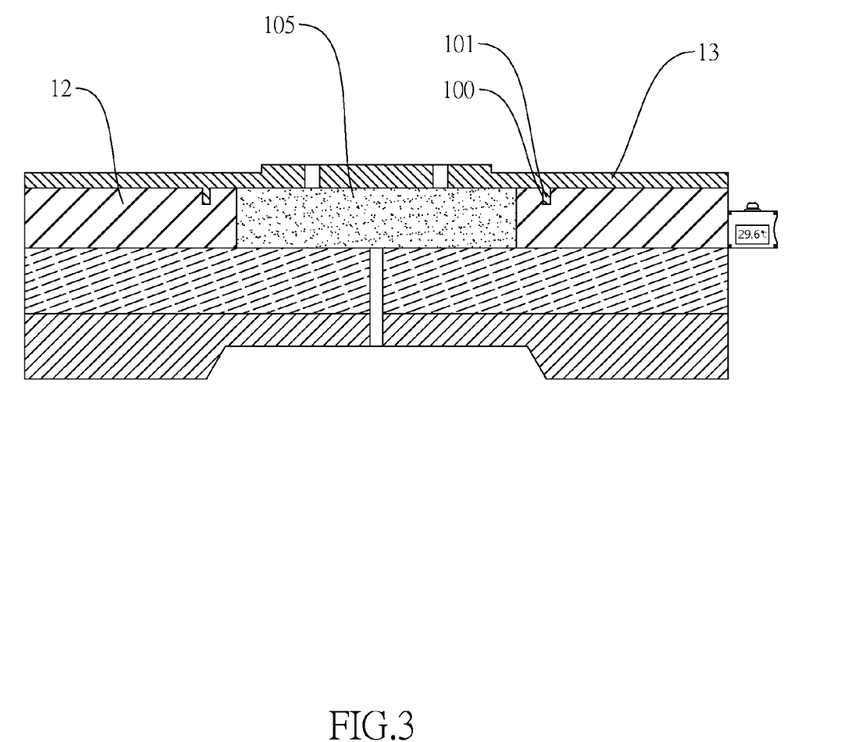
FIG. 3 is a schematic diagram of the wire bonding heating plate of the vacuum engaging mode of the invention.

Referring to FIG. 3 in conjunction with FIG. 1, the middle portion of the heat equalization layer 12 can be composed of porous materials 105. The top of the heat equalization layer can have a plurality of slots 100 and, in the current example, there are two slots 100.

Bottom of the top layer 13 has the engaging portion 101 which can be embedded in the slot 100 of the heat equalization layer 12. Once the engaging portion 101 and the slot 100 are engaged to each other, the heat equalization layer 12 and the top layer 13 are bonded to each other horizontally.

Afterward, the vacuum equipment is applied to vacuum the first through hole 102, causing the heat equalization layer 12 and the top layer 13 securely bonded to each other. When the replacement takes place, use the vacuum equipment to cease the vacuum and the heat equalization layer 12 and the top layer 13 will separate.

Figure 4A:
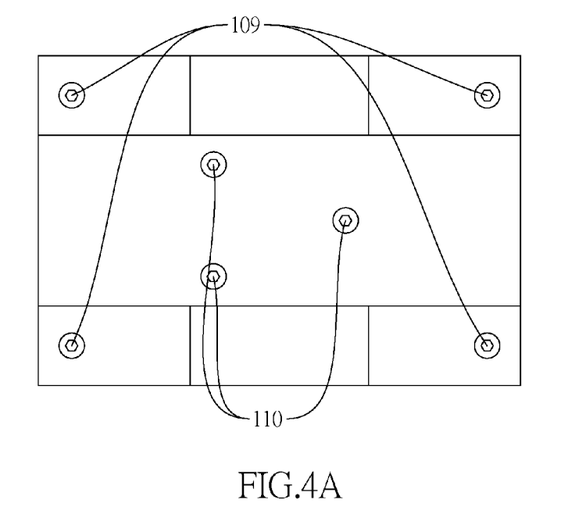
FIG. 4A is a schematic diagram of an adjusting method of the wire bonding heating plate of the invention.
Figure 4B:
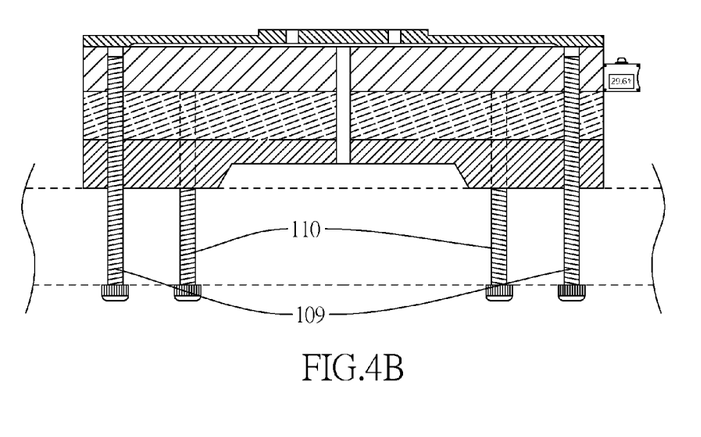
FIG. 4B is a schematic diagram of an adjusting method of the wire bonding heating plate of the invention.
Figure 5A:
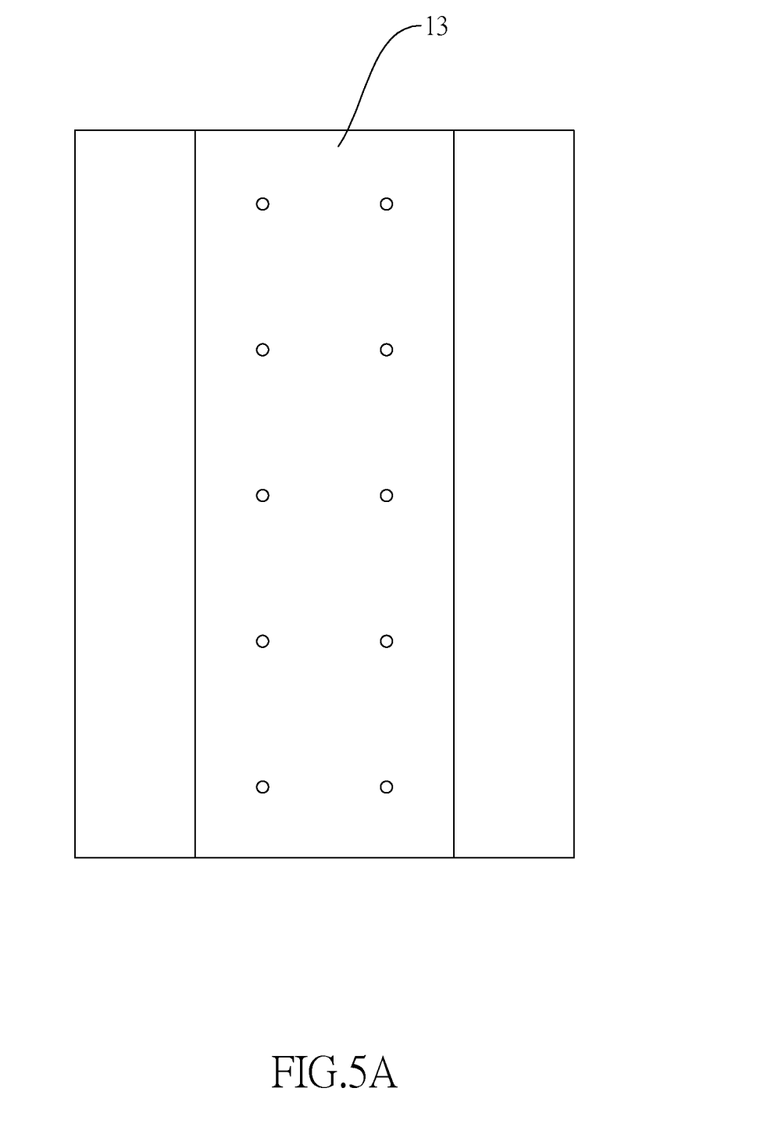
FIG. 5A is a schematic top view of the detachable top layer of the wire bonding heating plate of the invention.
Figure 5B:
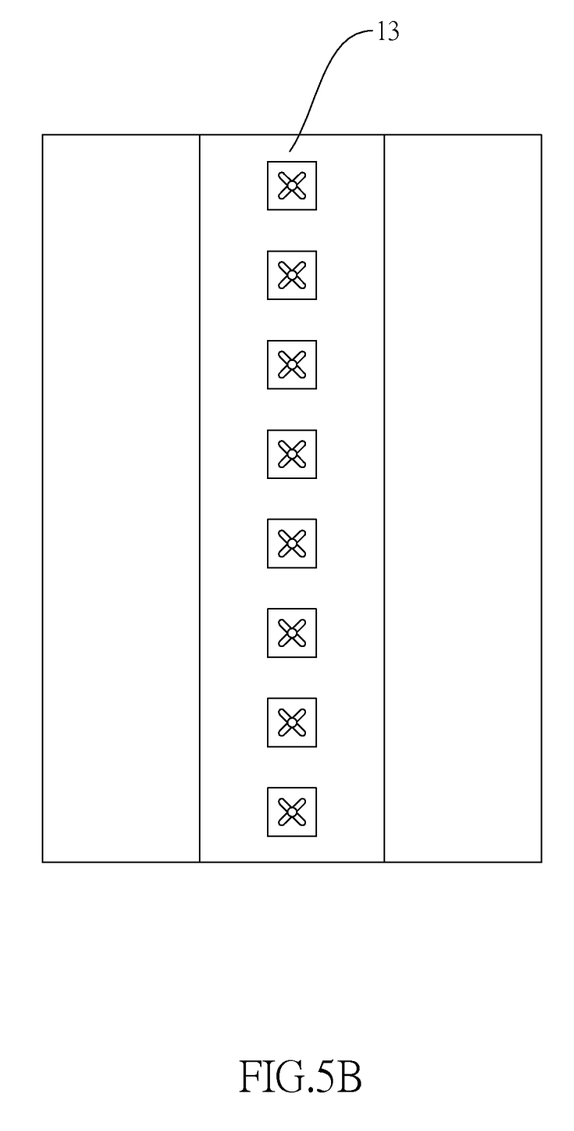
FIG. 5B is a schematic top view of the detachable top layer of the wire bonding heating plate of the invention.
Figure 5C:
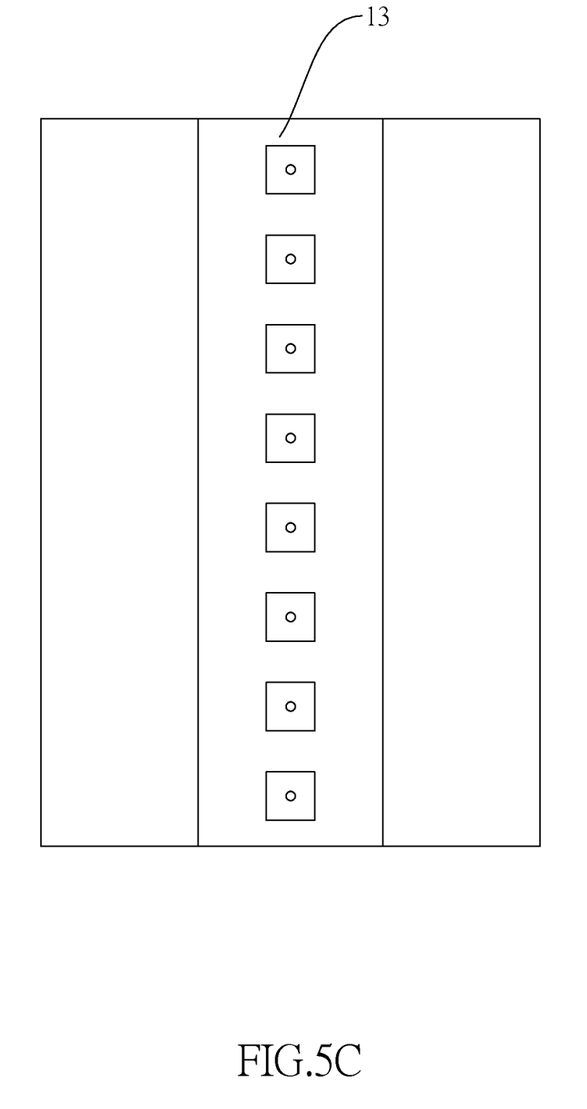
FIG. 5C is a schematic top view of the detachable top layer of the wire bonding heating plate of the invention.
Figure 5D:
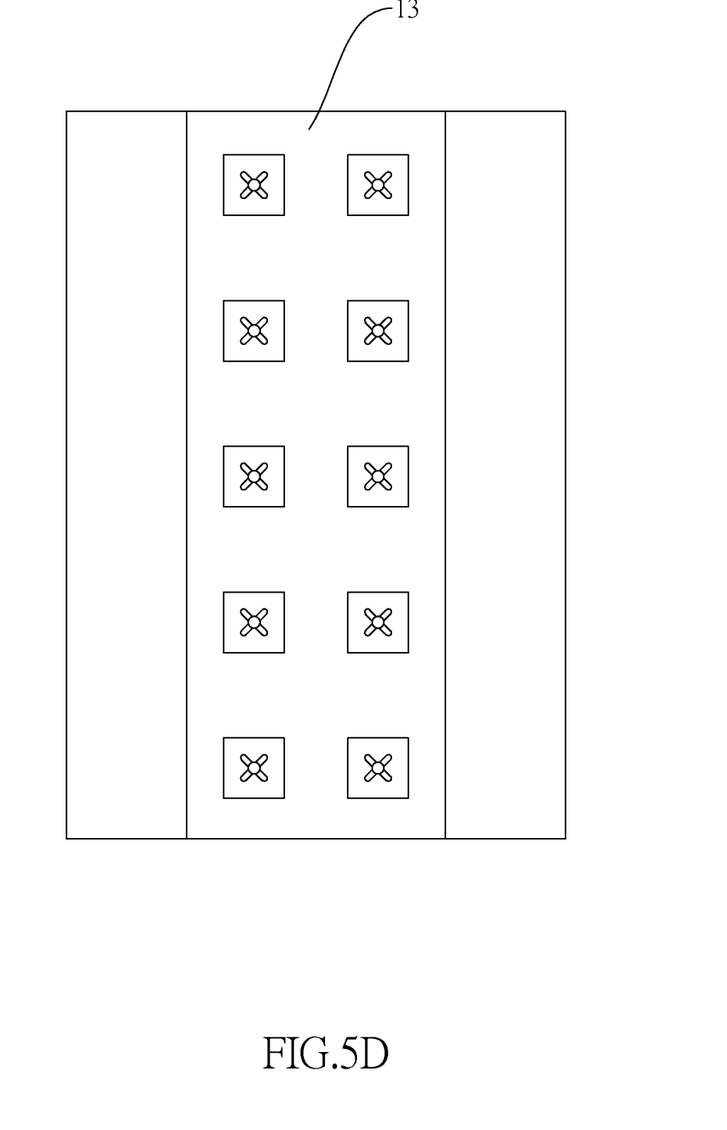
FIG. 5D is a schematic top view of the detachable top layer of the wire bonding heating plate of the invention.

Referring to FIGS. 4A and 4B in conjunction with FIG. 1, the invention includes an adjusting element 110 installed in the heating layer 10 and the heat blocking layer 11. The heating layer 10, the heat blocking layer 11, and the heat equalization layer 12 are equipped with the locking elements 109. When the invention is intended to be set on the machine platform, users can use the adjusting elements 110 to adjust the horizontal and vertical degrees of the heat equalization layer 12 based on the triangulation. After the adjustment, apply the locking elements 109 to securely bond the heating layer 10, the heat blocking layer 11, and the heat equalization layer 12 together, and place the top layer 13 thereon.

Referring to FIGS. 5A, 5B, 5C and 5D in conjunction with FIG. 1, when users conduct the wire bonding process, users need to remove the top layer 13 according to the requirements and replace with a proper top layer 13. The schematic diagrams shown in FIGS. 5A to 5D are for illustration only, and thus do not limit the invention to certain embodiments. As long as items, which work for the process of detaching from and replacing on the heat equalization layer 12, will serve the purpose.

Figure 6:
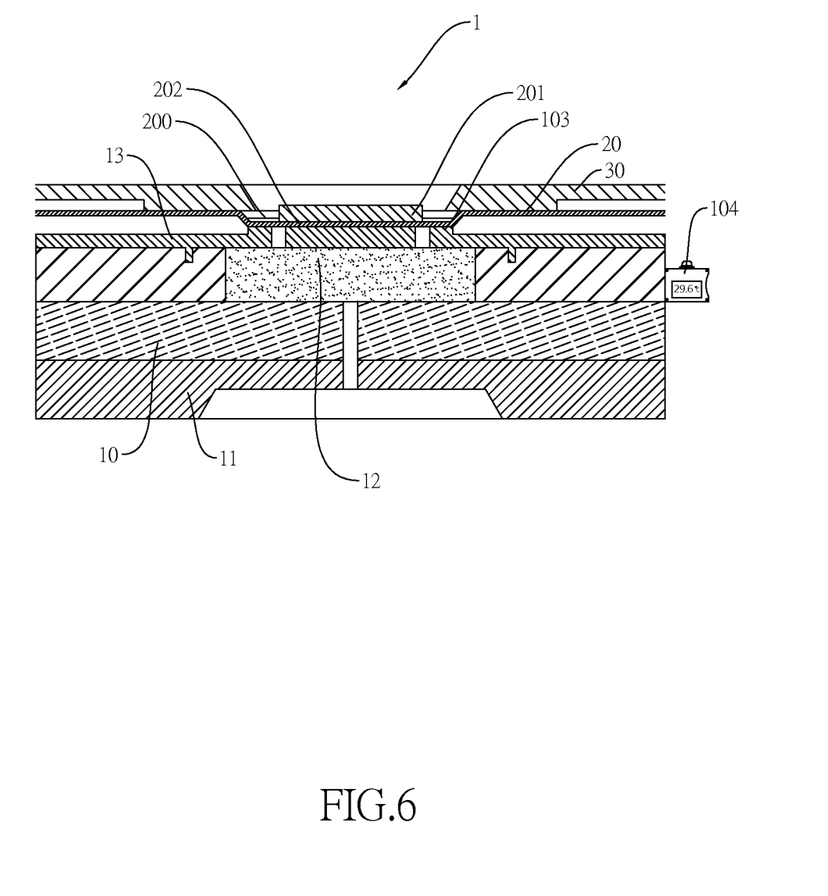
FIG. 6 is a schematic diagram of the wire bonding process of the wire bonding heating plate of the embodiment of the invention.

Referring to FIG. 6 in conjunction with FIG. 1, to implement the invention, the process utilizes mainly a press plate 30 to exert the lead frame 20 steadily on the heating plate 1, making the support block 103 to support the finger region 200 and the chip die pad 202 which supports the chip 201 thereon, in order to perform the wire bonding process. Users use heating layer 10 to provide heat. The heat is transferred upward to the heat equalization layer 12 and the heat blocking layer 11 delivers heat generated by the heating layer 10 completely to the heat equalization layer 12 to block the heat loss of the heat equalization layer 12. The heat equalization layer 12 directly heats up the top layer 13 to reach a required thermal level and thus the heat equalization layer 12 does not need to be heated constantly, resulting in the effectiveness of energy saving. The heat equalization layer 12 includes a temperature sensor 104 to monitor the temperature of the heat equalization layer 12 and to control the heating timing of the heating layer 10. Therefore, temperatures of the heat equalization layer 12 do not appear to have significant temperature differences. The aforementioned engaging, magnetic force and vacuum methods can be applied or combined freely for use in order to achieve the best effect of a secure bond.

In summary, the multi-functional detachable and replaceable wire bonding heating plate of the invention has the following advantages:

The multi-functional detachable and replaceable wire bonding heating plate of the invention can use engaging fix, magnetic attraction and vacuum methods to further secure the bond between the top layer and the heat equalization layer, and to make the detachment and replacement processes easier.

The multi-functional detachable and replaceable wire bonding heating plate of the invention has a heat blocking layer to block the heat loss of the heat equalization layer, can directly heat up the top layer, and can increase the thermal conductivity efficiency. Therefore, the heat equalization layer does not need to be heated constantly, and thus the effectiveness of energy saving can be achieved.

The multi-functional detachable and replaceable wire bonding heating plate of the invention includes the temperature sensor equipped in the heat equalization layer in order to monitor the temperature change of the heat equalization layer and to maintain the heat equalization layer at a proper temperature.

The multi-functional detachable and replaceable wire bonding heating plate of the invention uses the adjusting element and the locking element to adjust the overall horizontal and vertical degrees.

While the invention has been described in terms of preferred embodiments, those skilled in the art will recognize that the invention can be practiced with modifications within the spirit and scope of the appended claims.

What is claimed is:

1. A multi-functional detachable and replaceable wire bonding heating plate comprising:
   a heat blocking layer;
   a heating layer;
   a heat equalization layer; and
   a detachable replaceable top layer;
   wherein a bottom of the heat blocking layer is formed with a recessed portion;

wherein the heating layer is disposed on top of the heat blocking layer; and wherein the heat equalization layer is disposed on top of the heating layer;

further comprising:

the top layer disposed on top of the heat equalization layer;

a protruding support block disposed on top of the top layer; and a first through hole interconnected the heat blocking layer, the heating layer, and the heat equalization layer;

wherein the top layer includes a second through hole and a groove disposed in bottom of the top layer and connected the first through hole and the second through hole.

2. The multi-functional detachable and replaceable wire bonding heating plate of claim 1, wherein the top of the heat equalization layer comprises a slot and the bottom of the top layer comprises an engaging portion that is embedded in the slot.

3. The multi-functional detachable and replaceable wire bonding heating plate of claim 1, wherein the top of the heat equalization layer and the bottom of the top layer are attracted to each other by magnetic force.

4. The multi-functional detachable and replaceable wire bonding heating plate of claim 1, wherein the heat equalization layer is provided with a temperature sensor.

5. The multi-functional detachable and replaceable wire bonding heating plate of claim 1, wherein the heating layer, the heat blocking layer, and the heat equalization layer are provided with locking elements.

6. The multi-functional detachable and replaceable wire bonding heating plate of claim 1, wherein the heating layer and the heat blocking layer are provided with adjusting elements.

7. The multi-functional detachable and replaceable wire bonding heating plate of claim 1, wherein the middle portion of the heat equalization layer can be porous materials.

8. A multi-functional detachable and replaceable wire bonding heating plate comprising:

a heat blocking layer;

a heating layer;

a heat equalization layer; and a detachable replaceable top layer;

wherein a bottom of the heat blocking layer is formed with a recessed portion;

wherein the heating layer is disposed on top of the heat blocking layer; and wherein the heat equalization layer is disposed on top of the heating layer;

further comprising:

the top layer disposed on top of the heat equalization layer; and a protruding support block disposed on top of the top layer.

9. The multi-functional detachable and replaceable wire bonding heating plate of claim 8, wherein the top of the heat equalization layer comprises a slot and the bottom of the top layer comprises an engaging portion that is embedded in the slot.

10. The multi-functional detachable and replaceable wire bonding heating plate of claim 8, wherein the top of the heat equalization layer and the bottom of the top layer are attracted to each other by magnetic force.

* * * * *